United States Patent [19]

Ihara et al.

[11] 4,137,108
[45] Jan. 30, 1979

[54] PROCESS FOR PRODUCING A SEMICONDUCTOR DEVICE BY VAPOR GROWTH OF SINGLE CRYSTAL $Al_2O_3$

[75] Inventors: Masaru Ihara; Masayuki Jifuku, both of Kawasaki, Japan

[73] Assignee: Fujitsu Limited, Japan

[21] Appl. No.: 749,099

[22] Filed: Dec. 9, 1976

[30] Foreign Application Priority Data

Dec. 13, 1975 [JP] Japan ................................. 50/147926

[51] Int. Cl.$^2$ .................. H01L 21/205; H01L 21/76; H01L 21/86
[52] U.S. Cl. .................... 148/175; 29/576 E; 156/610; 156/612; 156/614; 357/49; 357/50; 357/54; 423/625; 423/630
[58] Field of Search .............................. 148/174, 175; 156/610–614; 423/625, 630; 29/576 E; 357/54, 49, 50; 427/248 R, 248 A, 248 B, 248 C

[56] References Cited

U.S. PATENT DOCUMENTS

| 3,293,074 | 12/1966 | Nickl | 148/175 X |
|---|---|---|---|
| 3,306,768 | 2/1967 | Peterson | 427/248 R |
| 3,331,716 | 7/1967 | Bloem et al. | 148/174 |
| 3,400,309 | 9/1968 | Doo | 148/175 X |
| 3,421,936 | 1/1969 | Vogel | 148/175 X |
| 3,449,147 | 6/1969 | Campbell et al. | 156/614 X |
| 3,564,358 | 2/1971 | Hahnlein | 357/49 |
| 3,740,280 | 6/1973 | Ronen | 357/49 X |
| 3,766,637 | 10/1973 | Norris et al. | 29/578 X |

FOREIGN PATENT DOCUMENTS 47-4829 2/1972 Japan.

OTHER PUBLICATIONS

Powell et al., Editors, *Vapor Deposition*, J. Wiley and Sons, N.Y., N.Y., 1966, pp. 383–386, 1966.
*Chemical Abstracts*, vol. 74, 1971, pp. 376–377, Abstract No. 147232p.
Wong et al., "Epitaxial Growth of Aluminum oxide .. ".
Tietjen et al., "Vapor Phase Growth. . .Semiconductors" Solid State Tech., Oct., 1972, pp. 42–49.
Hall et al., "Properties of Aluminum Oxide Films . . ." J. Electrochem. Soc., vol. 118, No. 10, Oct. 1971, pp. 1624–1626.

*Primary Examiner*—L. Dewayne Rutledge
*Assistant Examiner*—W. G. Saba
*Attorney, Agent, or Firm*—Staas & Halsey

[57] ABSTRACT

A single crystal of $Al_2O_3$ is epitaxially grown on an Si-single crystal of a semiconductor device by a vapor growth method. This vapor growth method employs starting materials of HCl, Al and $CO_2$. Further, this method advantageously employs a carrier gas to carry the gaseous product of the reaction of HCl with Al. An apparatus for the production of the above-mentioned semiconductor device comprises a chamber means for the reaction of the gaseous product and the single crystal, a reaction chamber for the reaction of Al and HCl, and an introducing tube for introducing $CO_2$ in the proximity of the Si-single crystal.

25 Claims, 2 Drawing Figures

PROCESS FOR PRODUCING A SEMICONDUCTOR DEVICE BY VAPOR GROWTH OF SINGLE CRYSTAL AL₂O₃

BACKGROUND OF THE INVENTION

1. Field of the Invention

The present invention relates to a process and an apparatus for the production of a semiconductor device, and more particularly to a process which includes a step of vapor growth of $Al_2O_3$ on an Si-single crystal of the semiconductor device, and still more particularly to a vapor growth of the $Al_2O_3$ on the Si-single crystal.

2. Description of the Prior Art

Various processes for growing $Al_2O_3$ on the Si-single crystal have been investigated and reported to employ an $Al_2O_3$ layer as the oxide of the semiconductor memory device, or as the protecting layer on the semiconductor surface. In the latter case, the $Al_2O_3$ film is used as an alternative to the Si oxide film. For the purpose of attaining the objects of the previous $Al_2O_3$ film used as for example, the protecting film, the conventional $Al_2O_3$ layer is either amorphous or polycrystalline and not dense. In addition, it is sufficient to form a thin $Al_2O_3$ film having a thickness from several hundred to several thousand angstroms in view of the above-mentioned objects of the conventional $Al_2O_3$ film.

According to known processes for producing the above-illustrated $Al_2O_3$ film, a starting material of the mixed system consisting of an alkyl derivative of aluminum—$CO_2$—$H_2$ or $AlCl_3$—$CO_2$—$H_2$ is contacted with an Si-substrate heated to a temperature of from 300 to 1000° C. There processes are inadequate for producing the single-crystal $Al_2O_3$ and also disadvantageous in view of the starting materials as illustrated hereinbelow.

From the aspect of the starting material of the conventional processes, particular problems are evident. The alkyl derivative of Al is dangerous to handle and decomposes a large amount of carbon at a temperature of approximately 300° C. The resulting carbon is then incorporated into the $Al_2O_3$ film. The $AlCl_3$, used as a component of one of the conventional starting materials, is known to have active deliquescence and to absorb water in the reaction system, with the result being that the surface of the Si-substrate is oxidized prior to growth of the $Al_2O_3$ film. The $Al_2O_3$ film therefore grows without having any relationship to the crystal orientation of the Si-substrate. It is, therefore, almost absolutely impossible to perform the formation of single crystalline $Al_2O_3$.

According to the conventional methods, the growth speeds of crystal are approximately several hundred angstroms per minute and are considerably lower than those required for performing the vapor growth of $Al_2O_3$ on an industrial scale.

SUMMARY OF THE INVENTION

Therefore, the principal object of the present invention is to provide a process for the production of a semiconductor device, in which production is by the vapor growth of epitaxial $Al_2O_3$ on an Si-single crystal.

It is another object of the present invention to provide a production process for a semiconductor device, wherein the growth rate and crystallographic properties of the $Al_2O_3$ film are improved.

Although the conventional SOS (Silicon on Sapphire) device attracts the attention of industry as an excellent, high-speed logic element because of its unique and attractive features, the SOS device, however, has not yet been adopted into the main current of the present semiconductor industry due to the problems summarized as follows:

(1) the SOS is more expensive than the element produced by a homogeneous, epitaxial growth of Si, and;

(2) the active Si-layer of the SOS has crystallographic properties inferior to those of a homogeneous, epitaxially grown Si active layer.

The reasons for problem (1) reside in the facts that (a) the sapphire substrate itself is quite expensive and (b) the previously developed polishing technique and the chemical surface treatment technique are difficult to apply to the sapphire. The reasons for problem (2) are considered to reside in the fact that unstable Al atoms are incorporated into the active Si-layer to become a P-type impurity, because the crystallographic properties of the sapphire are not necessarily good. In addition, the thin Si-layer usually having a thickness of several microns is grown on a thick sapphire substrate having a thickness of from 200 to 300 microns, with the result being that a strain due to incoherency generates in the Si-layer and deteriorates the crystallographic properties thereof. Further, the strain also may result from the difference in the thermal expansion between the sapphire substrate and the silicon layer.

It is, therefore, still another object of the invention to form a single-crystal sapphire film on the silicon substrate by the proposed vapor growth method of $Al_2O_3$, thereby overcoming the above-mentioned disadvantages (1) and (2) of the conventional SOS device.

In order to produce the improved SOS device at a cost comparable to the cost of the conventional semiconductor device, which comprises the Si-substrate and an epitaxial Si-film placed thereon, it is required to realize the cost reduction, by means of simultaneously treating a plurality of pieces of substrates in one batch. It is, however, impossible to treat a plurality of pieces of the substrate by means of the conventional processes.

It is still another object of the present invention to provide a production process for a semiconductor device, wherein the single-crystal $Al_2O_3$ films are simultaneously grown on a plurality of Si-single crystals.

It is a further object of the invention to provide an apparatus for performing the processes according to the invention.

According to the invention, there is provided a vapor growth process of $Al_2O_3$ for the production of a semiconductor device comprising an Si-single crystal and an epitaxial $Al_2O_3$ film on the Si-single crystal, the process comprising a vapor growth step of the $Al_2O_3$ film on one or more pieces of the Si-single crystal, and the vapor growth step further comprising the steps of:

(a) contacting an HCl gas with Al in the solid or liquid state, thereby obtaining a gaseous product;

(b) transferring the resultant gaseous product obtained in step (a) toward the region of the Si-single crystals;

(c) mixing the resultant gaseous product obtained in step (a) with a $CO_2$ gas, and, (d) contacting the resultant gaseous product mixed with the $CO_2$ gas of step (c), with one or more Si-single crystals heated to a temperature of from 950 to 1350° C., thereby growing the $Al_2O_3$ as a single crystal on each of the Si-single crystals.

According to the semiconductor production process of this invention including the vapor growth of $Al_2O_3$, it would be possible to produce various semiconductor devices.

As one example, an SOS semiconductor device having a novel structure can be produced, wherein a single-crystal sapphire film is formed on the silicon substrate having a thickness of from 200 to 300 microns. The active Si-layer is then formed by an epitaxial growth on the single-crystal sapphire film. The epitaxial Si-layer thus formed can be provided with excellent crystallographic properties comparable to that epitaxially grown on the Si-substrate. In addition, since the sapphire film is epitaxially grown, it possesses the excellent quality of a low incorporation of impurities. The stress created in the sapphire film due to the differences of the thermal expansion coefficients between the silicon active layer and the single crystalline sapphire layer can be reduced by the thick, underlying Si-substrate.

According to another example, an Si-epitaxial film is first formed on an Si-substrate, and a single-crystal film of $Al_2O_3$ is then epitaxially vapor-grown on the Si-epitaxial film. Various active layers of, for example, MOS-FET (Metallic Semiconductor-Field Effect Transistor) or bipolar semiconductor can be formed in the Si-epitaxial layer. The epitaxially grown $Al_2O_3$ film can be used as the oxide of MOS, thereby achieving an advantage of lowering the surface state of MOS due to the high level of purity of the single crystalline $Al_2O_3$.

According to still another example, an Si-epitaxial film is formed on a sapphire- or spinel-substrate, and a single crystal of $Al_2O_3$ is then epitaxially vapor-grown on the Si-epitaxial film. One of the advantages of the epitaxial $Al_2O_3$ film resides in the fact that it is possible to grow a further single crystalline Si-film thereon and to repeat the subsequent growth, thereby arranging semiconductor devices not only in the lateral direction but also in the perpendicular direction, by means of forming the devices on every single-crystal Si-film which is placed on every $Al_2O_3$ film.

According to yet another example, an Si-epitaxial film is formed on a GaP-substrate, and a single crystalline film of $Al_2O_3$ is then epitaxially vapor-grown on the Si-film. The epitaxial $Al_2O_3$ also allows the devices to form in the perpendicular direction.

The aluminum used according to one of the features of the invention should preferably possess a purity of 99.999% or more.

The aluminum may be in the state of a solid or a liquid, but it should be heated to a temperature suitable for the reaction with HCl, generally of from 500 to 700° C., preferably from 550 to 600° C. The prior art problem mentioned above resulting from the deliquescence is prevented by the employment of Al as one of the starting materials.

According to another feature of the invention, HCl gas is used as a reaction gas with Al. The flow rate of HCl should be such that the reaction efficiency of the HCl with Al approaches as close to 100% as possible. The flow rate of HCl per unit area of the cross-section of the chamber, in which the aluminum is positioned, can be from 0.8 to 166 cc/min cm² preferably from 8 to 50 cc/min cm². Water present in a minute amount in the HCl gas reacts with Al to form $Al_2O_3$ thereon. The water present in the HCl gas, therefore, does not oxidize the Si-substrate, and the epitaxial growth of $Al_2O_3$ on the Si-single crystal cannot be hindered by the presence of water in the HCl gas.

The HCl gas, which is usually maintained in its supplying source at room temperature, is contacted with the heated Al. Due to the above contact, the following reaction:

$$Al + 3HCl \rightarrow AlCl_3 + 3/2 H_2 \quad (1)$$

is believed to take place. The resultant gaseous product which is supposedly a mixture of $AlCl_3$ and $H_2$, is transferred to the region of one or more pieces of the single crystal.

The resultant gaseous product can be transferred to the region of the Si-single crystals by its own flow. It is, however, preferable to transfer the resultant gaseous product by a first carrier gas. The first carrier gas can generally be at least one member selected from the group consisting of $N_2$, Ar, He and $H_2$. The first carrier gas can be an $H_2$ gas alone, even though the $H_2$ gas possesses an insufficient mass and viscosity for satisfactorily moving the gas components of the resultant gaseous product due to the considerably low weight of the $H_2$ gas. The HCl gas may also be carried into the region of the Al by a second carrier gas, such as at least one of $H_2$, Ar, He and $N_2$, but excluding $CO_2$.

BRIEF DESCRIPTION OF THE DRAWINGS

The apparatus according to the invention is illustrated with reference to a preferable specific embodiment thereof shown in the attached drawings, wherein.

DESCRIPTION OF THE PREFERRED EMBODIMENTS

Figure 1:
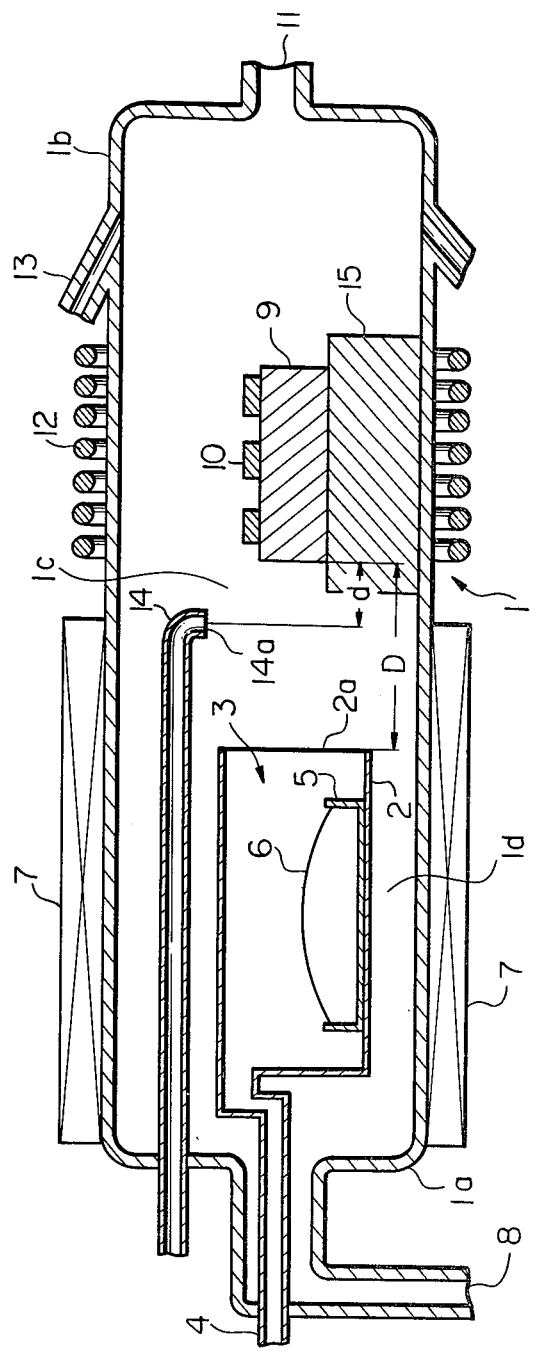
FIG. 1 is a longitudinal, schematic, cross-sectional view of the apparatus.

According to a preferred embodiment of the invention, the first carrier gas is at least one inert gas selected from the group consisting of Ar, He and $N_2$, or a mixture of at least one inert gas with the $H_2$ gas. This inert gas having a large mass and viscosity rapidly and homogeneously moves the gas molecules, to participate in the reaction with the Si-single crystal, into the region of the Si-single crystals and, then, expels the components reacted with the single crystals. The inert gas contained in the first carrier gas is advantageous for suppressing the epitaxially grown, single crystalline $Al_2O_3$ which is to be reduced by the $H_2$ gas. A small percentage or more by volume of the inert gas should preferably be contained in the first carrier gas to remarkably achieve the effects of both the transferring of the resultant gaseous product and the supression of the reduction, although the lower limit of the inert gas content may be less than a few percent by volume.

According to a further preferred embodiment of the invention, the resultant gaseous product is transported by the first carrier gas. Further, a plurality of pieces of the single crystals, for example substrates, is arranged in the flowing direction of the gaseous product. This further preferred embodiment enables the treatment of a large number of substrates in one batch. The thickness of single-crystal films of $Al_2O_3$ is homogeneous on every substrate arranged in the flowing direction of the gaseous product.

The flow rate of the first carrier gas exerts an effect on the homogeneity of the thicknesses of an $Al_2O_3$ layer grown on each piece of the Si-single crystals and should be determined depending upon the particular, selected flow rate of the second carrier gas in a manner such that both carrier gases flow at almost equal velocities. The flow rate of the first carrier gas can be from 3 l/min to 30 l/min, with regard to a reaction chamber having a cross-sectional area of 33 cm².

The flow rates of the HCl gas, the $CO_2$ gas and the carrier gases depend mainly on the number and the surface area of the Si-single crystals and the size of the chamber, in which the Al is placed. In a specific embodiment of the process according to the invention for treating three pieces of round Si-substrates having a diameter of 33 mm in the above chamber, the flow rate of HCl should be from 100 to 400 cc/min, the flow rate of $CO_2$ should be from 500 to 1500 cc/min, the first carrier gas for the gaseous product should be from 7000 to 8000 cc/min for $H_2$ gas alone, from 2000 to 3000 cc/min for the inert gas alone, and from 5000 to 6000 cc/min for the mixture of the $H_2$ gas and the inert gas in a volumetric ratio of 2 to 1, respectively.

The contacting surface of the Si-single crystal with the resultant gaseous product should be one of a (111) plane, a (110) plane and a (100) plane, preferably the (100) plane.

The $CO_2$ gas should be mixed with the resultant gaseous product, when the gaseous product arrives at the region of the Si-single crystal(s), thereby contacting the gaseous product with the single crystal(s) in the presence of $CO_2$. It is preferable to perform the above-mentioned mixing in the period as late as possible, while the gaseous product is moving to the region of the Si-single crystal(s), so that the oxidation by $CO_2$ takes place at a location as near as possible to the single crystal(s).

The oxidation by the $CO_2$ gas is believed to take place according to the reaction:

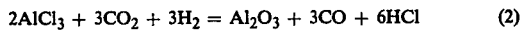

$$2AlCl_3 + 3CO_2 + 3H_2 = Al_2O_3 + 3CO + 6HCl \qquad (2)$$

The produced $Al_2O_3$ grows epitaxially on the single crystal(s).

The Si-single crystal should be heated to a temperature of from 950° C. to 1350° C., preferably from 1000° C. to 1300° C. If the temperature of the Si-single crystal is decreased below 950° C., the growth rate of the single-crystal $Al_2O_3$ will become too low from a practical point of view, and, also, the crystallographic properties will become deteriorated. On the other hand, if the temperature exceeds 1350° C., the Si-single crystal will become reactive so as to react with the resultant gaseous product obtained from the reaction of HCl with Al. Then it is impossible to obtain a desired epitaxial layer of $Al_2O_3$. When the temperature of the Si-single crystal is not less than approximately 1000° C., the crystal structure of $Al_2O_3$ is usually $\alpha$-type having a lattice constant of a = 4.76 angstroms. However, when the temperature is below approximately 1000° C., the crystal structure is $\gamma$-type.

It is possible, according to the invention to form a single crystal of from 30 to 50 microns in thickness at a growth rate of up to 0.5 microns/minute, after undergoing the contact of the Si-single crystal heated to a temperature of from 1200 to 1300° C. with the gas mixture of the gaseous product and $CO_2$, for a period of one hour.

When it is required to form a single crystalline Si film on the epitaxial $Al_2O_3$, a well-known process for the formation of epitaxial Si film can be employed, such as the decomposition of $SiH_4$ on the Si-single crystal heated to a temperature of from 900° C. to 1150° C., or such as the reduction of $SiCl_4$ by $H_2$ on the Si-substrate heated to a temperature of from 1100° C. to 1250° C.

Although the process according to the present invention is illustrated with reference to the vapor growth of $Al_2O_3$ on the Si-single crystal, it will be quite apparent for the skilled worker in the art, prior or subsequently to the vapor growth of $Al_2O_3$, to produce the other required elements of the semiconductor device, such as P- or N-type diffused layers, insulating layers, electrodes, and wirings, etc., by using a conventional method such as diffusion of impurities, photoresist technique, and a deposition of Si and metals for electrodes and the like.

In yet another preferred embodiment of the invention, a process is proposed for the production of a semiconductor device, such as the improved SOS device, comprising an Si-substrate, and an epitaxial $Al_2O_3$ film on the substrate and a single-crystal Si film on the $Al_2O_2$ film. This proposed process comprises a vapor growth step of the $Al_2O_3$ film on one or more pieces of the Si-single crystals, wherein the vapor growth step further comprises the steps of:

(a) heating aluminum to a temperature of from 500 to 700° C.;

(b) flowing HCl gas through a first passage to contact the HCl gas with the aluminum placed in the first passage, thereby obtaining a gaseous product from the contact;

(c) flowing a first carrier gas through a second passage to carry the resultant gaseous product obtained in step (b) into the region of the single crystals placed in the second passage;

(d) mixing the resultant gaseous product being carried by the firster carrier gas with a $CO_2$ gas, and;

(e) contacting the resultant gaseous product obtained in step (b) and mixed with $CO_2$ in step (d), with the Si-single crystals heated to a temperature of from 950° C. to 1350° C.

The proposed process further comprises a step of forming the single-crystal Si on each of the $Al_2O_3$ films, this forming step comprising:

(f) stopping all the steps related to the heating of the aluminum (a), the flowing of HCl gas (b), and mixing of $CO_2$ (d), and subsequently flowing $SiH_4$ through the second passage;

(g) flowing a gas consisting at least one selected from the group of $H_2$, $N_2$, Ar, and He through the first passage, and;

(h) heating the Si-single crystals to a temperature of from not less than 900° C. to 1150° C.

The step of forming the single crystalline Si on each of the $Al_2O_3$ can be the same as the above-mentioned step except that at least one member selected from the group consisting of $SiCl_4$, $SiH_3Cl$, $SiH_2Cl_2$ and $SiHCl_3$ is flow in the step (f). Further, the Si-single crystals are heated to a temperature of from 1100° C. to 1250° C.

These proposed processes are advantageous since the first and second passages, such as the conduit, chamber and the like, are used not only for the epitaxial growth of $Al_2O_3$ but also for the growth of Si and, therefore, presents the possibility of forming two kinds of layers in the same apparatus.

In accordance with the above-mentioned further object of the invention, there is provided an apparatus comprising:

(a) a first reaction chamber means having an inlet(s) for the first carrier gas;

(b) a plate positioned in the first reaction chamber means (a) and supporting the Si-single crystal(s);

(c) a second reaction chamber having one open end communicated with a source of HCl gas, this chamber being communicated with the inner space of the first reaction chamber (a) through the other open end of the second reaction chamber means and located in the first reaction chamber (a) in such a manner that the other open end is positioned between the supporting plate (b) and the inlet of the first reaction chamber (a);

(d) a vessel containing Al in the solid or liquid state positioned in the second reaction chamber means (c);

(e) a tube(s) for introducing a $CO_2$ gas, one end thereof communicating with a $CO_2$ gas source, and the other end thereof terminating between the supporting plate (b) and said other end of the second reaction chamber (c), the terminating position being directly upstream of the supporting plate (b) in the flowing direction of the first carrier gas;

(f) a heating means for said Al, and;

(g) a heating means for the Si-single crystal(s).

In accordance with a preferable embodiment of the apparatus, the inlet(s) of the first reaction chamber is alternately communicated with either the first carrier gas or a reaction gas of $SiH_4$. Further, the one open end of the second chamber means is alternately communicated with either the HCl gas or the second carrier gas, and, further, the $CO_2$ introducing tube is closable. The first carrier gas can be connected with, instead of the $SiH_4$, a reaction gas selected from the group of $SiCl_4$, $SiH_3Cl$, $SiH_2Cl_2$ and $SiHCl_3$. In this case, the second chamber must be communicated with an $H_2$ gas source instead of or in addition to the second carrier gas source. This tube could also be alternately communicated with either the $CO_2$ gas source or the $H_2$ gas source.

In FIG. 1, the vapor growth apparatus comprises a first reaction chamber in the form of a tube 1 of quartz and a second reaction chamber in the form of a hollow body 2 inserted into and fixed with respect to the main part 1a of the reaction tube 1. A supplying tube 4 exits from one end of the second chamber, hereinafter referred to as the hollow body 2, protrudes through the wall of the main part 1a of reaction tube 1 and communicates with the HCl gas source (not shown). The inner space 3 of the hollow body 2 communicates through the other end thereof 2a to the inner space of the first reaction chamber, hereinafter referred to as the reaction tube 1. A vessel in the form of a tray 5, consisting for example of quartz, is placed on the inner surface of the hollow body 2 and contains aluminum 6 in the solid- or liquid-state. The above-mentioned other end 2a of the hollow body 2 for carrying Al is positioned between the inlet 8 of the reaction tube 1 and the supporting plate 9. The hollow body 2 for carrying Al should preferably form an annular clearance 1d between the outer surface thereof and the inner surface of the reaction tube 1, said clearance 1d for effecting a uniform distribution of the first carrier gas around the hollow body 2. The HCl gas is introduced through the supplying tube 4 and is contacted with the Al-solid or melt 6 in the inner space 3. The resultant gaseous produce of this contact exits out of the inner space 3 by means of the kinetic energy of the reaction gas. The HCl gas may be transferred by a second carrier gas consisting of at least one gas selected from the group of $H_2$, $N_2$, Ar and He.

The first carrier gas, i.e., at least one selected from the group consisting of $H_2$, $N_2$, Ar and Ne, is introduced through the inlet 8 into the inner space 3 of the reaction tube 1. The first carrier gas, therefore, first flows through the annular clearance 1d and then into the space 1c between the hollow body 2 and the supporting plate 9. In this space the first carrier gas transfers the gases produced in the inner space 3 to the regions of the substrates 10 supported on the supporting plate 9.

The known heating means 7 drawn schematically, for example a resistance heater, surrounds the reaction tube 1 at both a region of the hollow body 2 and a region existing between the hollow body 2 and the supporting plate 9. The aluminum 6 in the vessel 5 is heated to the required temperature. The gaseous product produced in and supplied out of the hollow body 2 is also heated by the heating means 7.

The supporting plate 9, consisting of SiC, Nb and the like, is fixed in the reaction tube 1 by a base plate 15. The supporting plate 9 supports three substrates 10 in this embodiment arranged in the longitudinal axis of the reaction tube 1. The supporting plate 9 is separated from the hollow body 2 at a distance denoted by D. A known heating means 12, for example an induction coil, surrounds the reaction tube 1 at a region of the substrates 10 for heating these substates to the required vapor growth temperature.

The introduction tube 14 of the $CO_2$ communicates at one end with the unshown source of the $CO_2$ and protrudes longitudinally from the wall of the reaction tube 1. The other end, hereinafter referred to as the outlet end 14a, terminates in the inner space 1c of the reaction tube 1, between the hollow body 2 for carrying Al and the supporting plate 9. The horizontal distance from the plate 9 denoted by d should preferably be equal to from 1/5D to 1/3D, so that the oxidation reaction by $CO_2$ for producing $Al_2O_3$ can be initiated directly at the left side of the Si-substrates 10. The preferable distance of the outlet end 14a of the introduction tube 14 allows a homogeneous growth of $Al_2O_3$ on every substrate, seen in the flowing direction of the resultant gas mixture, and further prevents the oxidation of the Si substrates due to the direct collision of $CO_2$ thereon.

The cap part 1b of the reaction tube 1 is provided with an outlet 11 and is tightly sealed to the tubular body at the fitting part 13.

Although the apparatus according to the invention is illustrated with reference to FIG. 1, it is possible to perform the process according to the invention by apparatuses which are modified from the above-illustrated embodiment.

According to one modified embodiment, the outlet end 14a of the $CO_2$ introduction tube 14 terminates above the substrates 10. In this embodiment, it is required to completely cover the substrates 10 by the resultant gaseous product of the reaction of HCl and the solid- or liquid-Al 6, prior to the introduction of $CO_2$ onto the substrates 10.

According to another modified embodiment, the hollow body 2 with the supplying tube 4 is not employed, and the vessel of the aluminum is placed on the inner surface of the reaction tube 1. In this embodiment the gas is introduced through the inlet 8. The first carrier gas can be introduced into the inlet 8 or an opening provided through the wall between the vessel 5 and the supporting plate 9.

It would be extremely advisable, from a point of view of enhancing the production capacity of the semiconductor device, for example the SOS device, to have the supply tube 4 be alternately communicated with the HCl source and a second carrier gas source (not shown), and, to further have the inlet 8 also be alternately communicated with the previously mentioned first carrier gas and the SiH$_4$ gas source. When one of the gases SiH$_3$Cl, SiH$_2$Cl or SiHCl$_3$ is used for the deposition of Si and the source of this gas is alternately communicated to the supply tube 4, the H$_2$-gas source must be alternately communicated to the inlet 8. In these cases, when the single crystal of Al$_2$O$_3$ is grown on the substrates 10, the step for forming a single crystal of Si can be initiated immediately. The method of forming the single-crystal Si is well-known in the art and is thus explained only with reference to the special construction of the apparatus shown in FIG. 1. First, it should be noted that the introduction of CO$_2$ through the tube 14 should be terminated prior to the introduction of SiH$_4$ and the like, in order to prevent the oxidation of SiH$_4$ or the grown Si film by CO$_2$. Secondly, the heating of Al 6 should also be terminated prior to the introduction of SiH$_4$ and the like. The second carrier gas can be one or more of H$_2$, Ar, N$_2$ and He. The heating means 12 should heat the substrates 10 at a temperature from 900° C. to 1150° C. in the case of using SiH$_4$, and from 1100° to 1250° C. in the case of using SiCl$_4$ and the like.

The process according to the invention is illustrated by way of using specific examples.

EXAMPLE 1

The epitaxial growth of the single-crystal Al$_2$O$_3$ was performed by the apparatus shown in FIG. 1 and under the conditions listed in Table I. The inner diameter of the reaction chamber was 44 mm.

Table I

| Si-substrate | Size and dimension | Round disc of 33 mm in diameter |
|---|---|---|
| | Surface of growth | (111), (110) and (100) |
| | Number of pieces | Three pieces of one of the surfaces per batch |
| | Heating temperature | 1270° C |
| Aluminum | Purity | 99.999% |
| | Heating temperature | 600° C |
| | Weight | 50 grams |
| HCl gas | Flowing rate | 150 cc/minute |
| 1st carrier gas | Flowing rate | H$_2$. 3 l/minute |
| | | N$_2$. 2 l/minute |
| CO$_2$ gas | Flowing rate | 1 l/minute |

The Si-substrate and the aluminum were heated to the determined temperatures, while flowing the carrier gas from the inlet 8. The HCl gas was then introduced from the inlet 4. Three minutes after the introduction of HCl, the CO$_2$ gas was introduced for a period of one hour.

The produced film on the (111) surface of each of the three substrates had a thickness of 30 microns.

One of the produced films was subjected to an X-ray diffraction measurement. As a result of the measurement, it was proved that a single crystal of α-Al$_2$O$_3$ was formed and, further, that the plane of Al$_2$O$_3$ grown on the substrate was (0001).

EXAMPLE 2

The procedure according to Example 1 was repeated except that the first carrier gas was H$_2$ gas at a flowing rate of 5 l/minute. The obtained films consisted of α-Al$_2$O$_3$. Thicknesses of 25, 5 and 1 microns, respectively, were grown on the substrates located upstream, in the middle and downstream of the gas flow, as seen in the flowing direction of the carrier gas.

EXAMPLE 3

The vapor growth was performed using the apparatus as shown in FIG. 1 and under the conditions listed in Table II.

Table II

| Si-substrate | Size and dimension | Round disc of 33 mm in diameter |
|---|---|---|
| | Surface of growth | (111) |
| | Number of pieces | Three pieces of one of the surfaces per batch |
| | Heating temperature | 980° C |
| Aluminum | Purity | 99.999% |
| | Heating temperature | 560° C |
| | Weight | 50 grams |
| HCl gas | Flowing rate | 30 cc/minute |
| 1st carrier gas | Flowing rate | H$_2$ 2 l/minute |
| | | N$_2$ 3 l/minute |
| CO$_2$ gas | Flowing rate | 1 l/minute |

Figure 2:
FIG. 2 shows an electron diffraction pattern for a single-crystal $Al_2O_3$ layer of this invention.

The Al$_2$O$_3$ film was grown on the Si-substrates at a rate of 0.05 micron/minute. When the Al$_2$O$_3$ film grew to a thickness of a 1 micron, the vapor growth procedure was terminated, and, thereafter, the produced film was subjected to electron diffraction. The resulting photograph of the electron diffraction is shown in FIG. 2, which proves the grown Al$_2$O$_3$ to be a single crystal of the γ-type.

EXAMPLE 4

The epitaxial growth of Si was performed after the epitaxial growth of Al on the (111) plane of Si substrates, was completed in Example 1.

The flow of HCl gas was stopped and directly after the second carrier gas was flowed at a rate shown in Table III below. This second carrier gas does only prevent the back-blowing of the gases present in the reaction tube 1 into the hollow body 2.

The heating of Al by the heater 7 was then stopped.

The temperature of the substrates 10 was decreased from 1270 to 1050° C. over a selected period of five minutes so as to avoid stresses being generated in the substrates.

Ten minutes after stopping the supply of the HCl and CO$_2$ gases, SiH$_4$ was introduced from the inlet 8 at a rate shown in Table III.

The epitaxial growth of Si on the Al$_2$O$_3$ film was then started under the following conditions.

Table III

| Si-substrate | Heating temperature | 1050° C |
|---|---|---|
| 2nd carrier gas | Flow rate | H$_2$ 10 l/minute |
| | | He 10 l/minute |
| SiH$_4$ gas | Composition of used gas | a mixture of 90% H$_2$ and 10% SiH$_4$ |
| | Flow rate (in terms of the mixture) | 2 l/minute |

As a result, the single crystal of Si was epitaxially grown at a growth speed of 2 microns per minute. Although impurites were not intentionally doped into the epitaxial Si, this epitaxial Si had a P-type conductivity of a concentration of $10^{16}$ to $10^{17}$ cm$^{-3}$. This conductivity is believed to be a decomposition of a part of the Al$_2$O$_3$ crystal. The epitaxial Si had a crystal plane of (111), and a Hall mobility of less than $10^2$ cm$^2$/volt-sec.

What we claim is:

1. A process for the production of at least one semiconductor device comprising an Si-single crystal and an epitaxial Al$_2$O$_3$ film on the Si-single crystal, said process comprising vapor growth of the $Al_2O_3$ film on at least one piece of said Si-single crystal, wherein said vapor growth comprises steps of:
(a) contacting an HCl gas with Al in a selected one of solid and liquid states, thereby obtaining a gaseous product;
(b) transferring said resultant gaseous product toward the region of said Si-single crystal(s);
(c) mixing said resultant gaseous product with a $CO_2$ gas;
(d) heating said Si-single crystal(s) heating to a temperature of from 950 to 1350° C.; and
(e) contacting said resultant gaseous product, mixed with $CO_2$ with said Si-single crystal(s), thereby growing the $Al_2O_3$ as a single crystal on said Si-single crystal(s).

2. A process according to claim 1, wherein said Al is heated to a temperature of from 500 to 700° C.

3. A process according to claim 1, wherein said Si-single crystal(s) is heated to a temperature of from 1000 to 1300° C. to grow an $\alpha$-$Al_2O_3$.

4. A process according to claim 1, wherein said Si-single crystal(s) is heated at a temperature of from 950 to less than 1000° C. to grow a $\gamma$-$Al_2O_3$.

5. A process according to claim 1, wherein said mixing step (c) is performed directly prior to said contacting step (e).

6. A process according to claim 1, wherein said transferring step (b) is performed by flowing at least one first carrier gas selected from the group consisting of $N_2$, Ar, He and $H_2$.

7. A process according to claim 6, wherein said Al is heated to a temperature of from 500 to 700° C.

8. A process according to claim 6, wherein said Si-single crystal(s) is heated to a temperature of from 1000 to 1300° C. to grow an $\alpha$-$Al_2O_3$.

9. A process according to claim 6, wherein said Si-single crystal(s) is heated to a temperature of from 950 to less than 1000° C. to grow a $\gamma$-$Al_2O_3$.

10. A process according to claim 6, wherein said mixing step (c) is performed directly prior to said contacting step (e).

11. The process of claim 1 wherein said heating of said Si-single crystal(s) is by electrical induction heating.

12. A process for the production of at least one semiconductor device comprising an Si-single crystal, an epitaxial $Al_2O_3$ film on said Si-single crystal and a single-crystal Si film on said $Al_2O_3$ film, said process comprising vapor growth of said $Al_2O_3$ film on at least one piece of said Si-single crystal, wherein said vapor growth further comprises steps of:
(a) heating aluminum to a temperature of from 500 to 700° C.;
(b) flowing HCl gas through a first passage to contact the HCl gas with said aluminum placed in the first passage, thereby obtaining a gaseous product from said contact;
(c) flowing a first carrier gas through a second passage to carry said resultant gaseous product into the region of said Si-single crystal(s) placed in said second passage;
(d) mixing said resultant gaseous product being carried by said first carrier gas with a $CO_2$ gas;
(e) heating said Si-single crystal(s) to a temperature of from 950 to 1350° C.; and
(f) contacting said resultant gaseous product mixed with $CO_2$ with said Si-single crystal(s), and wherein
said process further comprises a step of forming said single-crystal Si film on each said $Al_2O_3$ film, this forming step comprising:
(g) stopping all the steps of said heating of said aluminum (a), said flowing of HCL gas (b), said mixing of $CO_2$ (d), and subsequently flowing $SiH_4$ through said second passage;
(h) flowing at least one gas selected from the group consisting of $H_2$, $N_2$, Ar and He through said first passage; and,
(i) heating said Si-single crystal to a temperature of from 900° to 1150° C.

13. A process according to claim 12, wherein said Si-single crystal(s) is heated in step (e) a temperature of from 1000° to 1300° C. to grow an $\alpha$-$Al_2O_3$.

14. A process according to claim 12, wherein said Si-single crystal(s) is heated in step (e) to a temperature of from 950° to less than 1000° C. to grow a $\gamma$-$Al_2O_3$.

15. A process according to claim 12, wherein said mixing step (d) is performed directly prior to said contacting step (f).

16. A process according to claim 12, wherein said first carrier gas comprises at least one gas selected from the group consisting of $N_2$, Ar, He and $H_2$.

17. A process according to claim 12, wherein said second carrier gas comprises at least one gas selected from the group consisting of $N_2$, Ar, He and $H_2$.

18. The process of claim 12 wherein said heating of said Si-single crystal(s) is by electrical induction heating.

19. A process for the production of a semiconductor device comprising an Si-single crystal, an epitaxial $Al_2O_3$ film on said Si-single crystal and a single-crystal Si film on said $Al_2O_3$ film, said process comprising vapor growth of said $Al_2O_3$ film on at least one piece of said Si-single crystal(s), wherein said vapor growth comprises steps of:
(a) heating aluminum to a temperature of from 500° to 700° C.;
(b) flowing an HCl gas through a first passage to contact the HCl gas with the aluminum placed in the first passage, thereby obtaining a gaseous product from the contact;
(c) flowing a first carrier gas through a second passage to carry said resultant gaseous product into the region of said Si-single crystal(s) placed in a second passage;
(d) mixing said resultant gaseous product being carried by the first carrier gas with a $CO_2$ gas;
(e) heating said Si-single crystal(s) to a temperature of from 950° to 1350° C.; and
(f) contacting said resultant gaseous product mixed with $CO_2$, with said Si-single crystal(s), and wherein
said process further comprises forming said single-crystal Si film on each $Al_2O_3$ film, this forming step comprising:
(g) stopping all the steps of said heating of said aluminum (a), said flowing of HCl gas (b), said mixing of $CO_2$ (d) and subsequently flowing through said second passage at least one gas selected from the group consisting of $SiCl_4$, $SiH_3Cl$, $SiH_2Cl_2$ and $SiHCl_3$;
(h) flowing $H_2$ gas through said first passage; and, (i) heating said Si-single crystal(s) to a temperature of from 1100 to 1250° C.

20. A process according to claim 19, wherein said Si-single crystal(s) is heated in step (e) to a temperature of from 1000° to 1200° C. to grow an $\alpha$-$Al_2O_3$.

21. A process according to claim 19, wherein said Si-single crystal(s) is heated in step (e) to a temperature of from 950° to less than 1000° C. to grow a $\gamma$-$Al_2O_3$.

22. A process according to claim 19, wherein said mixing step (d) is performed directly prior to said contacting step (e).

23. A process according to claim 19, wherein said first carrier gas comprises at least one gas selected from the group consisting of $N_2$, Ar, He and $H_2$.

24. A process according to claim 19, wherein said $H_2$ gas in step (h) is carried by at least one carrier gas comprising at least one gas selected from the group consisting of $N_2$, Ar, and $H_2$.

25. The process of claim 19 wherein said heating of said Si-single crystal(s) is by electrical induction heating.

* * * * *

UNITED STATES PATENT AND TRADEMARK OFFICE
CERTIFICATE OF CORRECTION

PATENT NO. : 4,137,108
DATED : January 30, 1979
INVENTOR(S) : MASARU IHARA ET AL.

It is certified that error appears in the above-identified patent and that said Letters Patent are hereby corrected as shown below:

In the Abstract, line 5, "advantageouslyemploys" should be --advantageously employs--;

Col. 1, line 33, "There" should be --These--;

Col. 4, line 52, "supression" should be --suppression--;

Col. 6, line 33, "firster" should be --first--;

Col. 8, line 22, "substates" should be --substrates--;

Col. 12, line 8, "HCL" should be --HCl--.

Signed and Sealed this

Nineteenth Day of June 1979

[SEAL]

Attest:

RUTH C. MASON
Attesting Officer

DONALD W. BANNER
Commissioner of Patents and Trademarks